(12) United States Patent
Takano et al.

(10) Patent No.: US 7,071,771 B2
(45) Date of Patent: Jul. 4, 2006

(54) CURRENT DIFFERENCE DIVIDER CIRCUIT

(75) Inventors: Yoshinori Takano, Ichikawa (JP); Tadayuki Taura, Zushi (JP); Toru Tanzawa, Ebina (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 132 days.

(21) Appl. No.: 10/954,271

(22) Filed: Oct. 1, 2004

(65) Prior Publication Data

US 2005/0117381 A1 Jun. 2, 2005

Related U.S. Application Data

(60) Continuation-in-part of application No. 10/661,571, filed on Sep. 15, 2003, now Pat. No. 6,807,097, which is a division of application No. 10/006,395, filed on Dec. 10, 2001, now Pat. No. 6,639,837.

(30) Foreign Application Priority Data

Dec. 11, 2000 (JP) .............................. 2000-376501

(51) Int. Cl.
*G05F 1/10* (2006.01)
(52) U.S. Cl. ...................... 327/543; 327/513
(58) Field of Classification Search ................ 323/312, 323/313, 314, 315, 316; 327/512, 513, 530, 327/534, 535, 537, 538, 539, 540, 541, 543
See application file for complete search history.

(56) References Cited

U.S. PATENT DOCUMENTS

| | | | |
|---|---|---|---|
| 5,163,021 A | 11/1992 | Mehrotra et al. | |
| 5,508,958 A | 4/1996 | Fazio et al. | |
| 5,596,526 A | 1/1997 | Assar et al. | |
| 5,764,571 A | 6/1998 | Banks | |
| 5,768,191 A | 6/1998 | Choi et al. | |
| 5,774,395 A | 6/1998 | Richart et al. | |
| 5,917,753 A | 6/1999 | Dallabora et al. | |
| 5,982,662 A | 11/1999 | Kobayashi et al. | |
| 6,094,374 A | 7/2000 | Sudo | |
| 6,108,263 A | 8/2000 | Bauser et al. | |
| 6,205,056 B1 | 3/2001 | Pan et al. | |
| RE37,611 E | 3/2002 | Roohparvar | |
| 6,477,090 B1 | 11/2002 | Yamaki et al. | |
| 6,560,143 B1 | 5/2003 | Conley et al. | |
| 6,567,312 B1 | 5/2003 | Torii et al. | |
| 6,687,160 B1 | 2/2004 | Fan et al. | |

FOREIGN PATENT DOCUMENTS

| | | |
|---|---|---|
| JP | 11-134878 | 5/1999 |
| JP | 11-273386 | 10/1999 |

*Primary Examiner*—Jeffrey Zweizig
(74) *Attorney, Agent, or Firm*—Oblon, Spivak, McClelland, Maier & Neustadt, P.C.

(57) ABSTRACT

A current difference divider circuit with a plurality of current sources is provided. The divider circuit includes a first current source which is operable to generate a first current, a second current source for generation of a second current less in magnitude than the first current, and a third current source for generating a difference current with its magnitude equivalent to a difference between the first and second currents and for generating a third current resulting from the division thereof. The circuit further includes a fourth current source for generating a fourth current obtainable by mirroring of the second current. The third and fourth currents are added together to provide a fifth current, which is then output.

4 Claims, 12 Drawing Sheets

FIG. 6
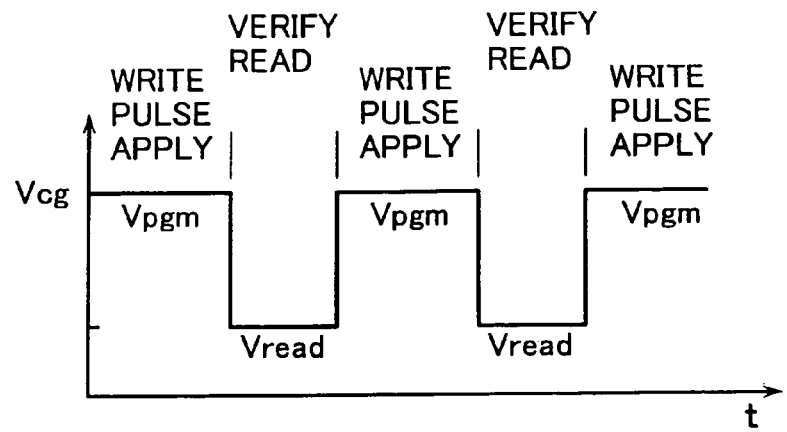
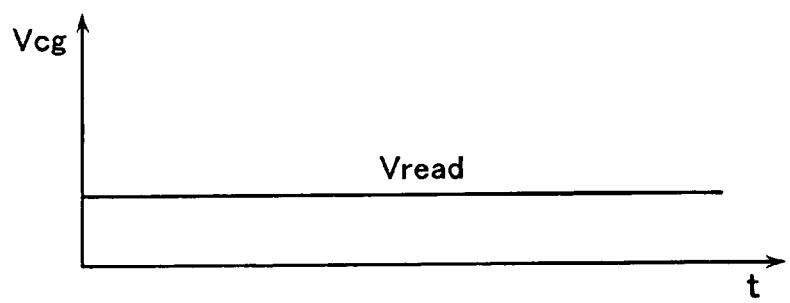
FIG. 7
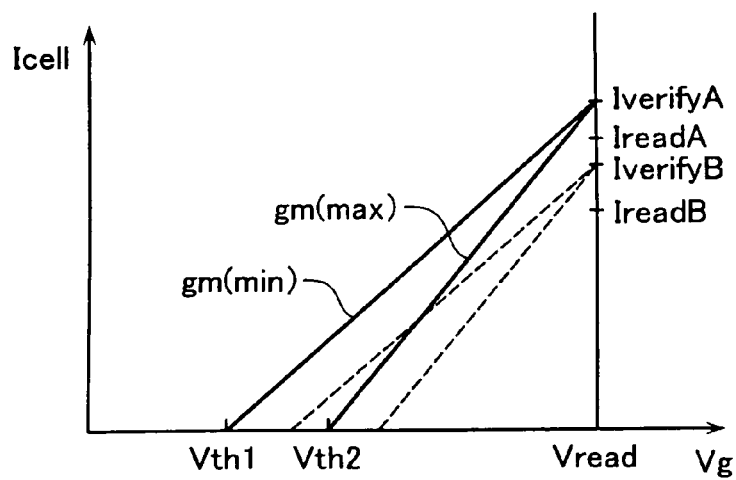

CURRENT DIFFERENCE DIVIDER CIRCUIT

CROSS-REFERENCE TO RELATED APPLICATIONS

This application is a Continuation in Part of U.S. patent application Ser. No. 10/661,571, filed Sep. 15, 2003, now U.S. Pat. No. 6,807,097, which is a Divisional of U.S. patent application Ser. No. 10/006,395, filed Dec. 10, 2001, now U.S. Pat. No. 6,639,837, issued Oct. 28, 2003, and is based on and claims the benefit of priority from the prior Japanese Patent Application No. 2000-376501, filed on Dec. 11, 2000. The entire contents of these applications are incorporated herein by reference.

BACKGROUND OF THE INVENTION

1. Field of the Invention

The present invention relates to current difference dividing circuitry using a plurality of current sources.

2. Description of the Related Art

Electrically erasable programmable read only memories (EEPROMs) are arranged to include an array of memory cells, each of which typically has a transistor structure with a floating gate for electrical carrier retention and a control gate as insulatively stacked or "multilayered" over the floating gate. This memory cell is designed to exhibit a threshold voltage-increased state with electrons injected into the floating gate and a threshold voltage-decreased state with the floating gate electrons released away, which are used for storage of binary digital data bits of a logic "1" and a "0," respectively. The memory cell's data may be read out by first giving a read voltage to the control gate thereof and then detecting or sensing whether this cell turns on (called "on-cell") to pull a current thereinto or alternatively is kept turned off (called "off-cell").

Currently available sense amplifiers for memory cell data detection include current-sensing amplifiers. Typically a sense amplifier has a sense node and a reference node. A bit line associated with a selected memory cell is connected to the sense node. Connected to the sense-amp reference node is a reference cell, which permits a reference current for data detection to flow therein. The reference cell is the one that is the same in structure as the EEPROM memory cells. A reference current conducted thereby is typically set at a level that is about one-half of a current of the on-cell. With such an arrangement, the intended data detection is done through comparison of a memory cell current with a current of the reference cell.

EEPROM cells inherently have a variation or deviation in mutual conductance gm value, which can occur due to changes in fabrication process parameters. Observing this state with respect to a memory cell current, experimentation results are as shown in FIG. 18. FIG. 18 is a graph showing a relationship of a control gate voltage Vcg and cell current Icell. Here, there is demonstrated a variation of the cell current Icell occurring upon application of a read voltage Vread to the control gate of a selected memory cell with its threshold voltage Vth. In a way corresponding to a range of from a maximal mutual conductance value gm(max) to a minimal value gm(min), the resultant cell read current would vary within the range of Icell(max) to Icell(min).

As previously stated, the reference current Iref of a reference cell as indicated by dotted line in FIG. 18 is set so that it is about half of the on-cell's current. If the minimal cell current Icell(min) becomes less than the reference current Iref due to possible variation of gm value, erroneous read can occur. Even where the reference current reduction causes no such read errors, a lengthened time period must be required to execute read due to the fact that an appreciable difference between the cell current and reference current stays less. This makes it impossible to read data at high speeds.

The above problem becomes more serious in the case of multiple-value data storage architectures with the capability for storing multiple bits of information on a single memory cell transistor, also known as "multiple-bit-level-per-cell" or "multi-level cell (MLC)" technologies. For instance, a multi-bit-per-cell storage scheme is known which employs memory cells of the same structure as those used in the case of two-level or "binary" data storage and which precisely controls threshold value distributions in a way as shown in FIG. 19. The multibit scheme as shown herein is aimed at storage of four-value data with voltage levels "00," "01," "10," and "11" in the order that one with a lower threshold voltage precedes others with higher threshold voltages.

Data "00" is considered equivalent to the state that a memory cell is at its lowest threshold voltage (called "Vth level" from time to time) with electrons released away from the floating gate thereof—for example, define this as an erase state. In order to write or program data "10" from this erase state, perform writing of a logic "1" of an upper level bit. To write data "01," execute write of a "1" of lower bit. To write data "11," first write data "01" and then execute "1"-write of upper bit.

Upon execution of the data write or erase operation, a verify-read operation is to be done for forcing each data bit to fall within a prespecified threshold voltage distribution in a similar way to that in the case of binary data. To guarantee the upper and lower limits of such threshold voltage distribution in accordance with respective data "00," "01" and "10" of FIG. 19, several read voltages (Vvl0, Vvu0), (Vvl1, Vvu1), (Vvl2, Vvu2) should be required in verify-read events.

The resultant threshold voltage distribution of each data thus guaranteed thereby is as follows. For instance, in the case of "00," it falls within a range of from 1.5 to 2.5 volts (V). In the case of "01," it ranges from 3.5 to 4.5V. In the case of "10," it is from 5.5 to 6.5V. For "11," 7.7V or more.

In contrast, in normal or ordinary read operations, read voltages Vread0, Vread1, Vread2 are used, each of which is potentially set between adjacent ones of respective data's threshold voltage distributions.

To perform such highly precise threshold-voltage distribution control, an increased number of values or levels must be required for the ordinary read and verify-read voltages; in addition, the possible variation/deviation of gm values of memory cells stated previously becomes greater in influenceablity. This can be said because it is required to set up, at fine intervals with increased precision, the reference current of a reference cell in a way pursuant to each ordinary read voltage and verify-read voltage, which would result in a decrease in allowable deviation range of the cell current Icell due to a change in gm as has been discussed in conjunction with FIG. 18.

And, for preclusion of any read errors, an increase in margin should be required in such a way that a marginal space or "interspace" between respective data threshold voltage distributions is set at 1.5V rather than 1V, by way of example. Unfortunately, such margin expansion in this way can result in an extra increase in the upper limit value of a read voltage(s). This upper-limit value increase causes application of a higher voltage to memory cells once at a time whenever a read operation is executed, which in turn causes EEPROMs to decrease in reliability. Another problem encountered with the approach is a decrease in on-chip net areas for layout of memory cells and associative circuitry. This is resulted from an unwanted increase in chip occupation area of "booster" circuits that are operable to generate any required high potential voltages such as read voltages or else. Obviously, the greater the requisite number of high voltages, the more the on-chip area of such boosters.

BRIEF SUMMARY OF THE INVENTION

In accordance with one form of the present invention, a current difference dividing circuit includes a first current source for generation of a first current, a second current source for generating a second current less in magnitude than the first current, a third current source for generating a difference current with its magnitude equivalent to a difference between the first and second currents and for generating a third current resulting from division thereof, and a fourth current source for generating a fourth current obtainable by mirroring of the second current. The third current and the fourth current are added together to thereby provide a fifth current, which is then output.

BRIEF DESCRIPTION OF THE DRAWINGS

FIG. 6 is a diagram showing major voltage waveforms in a write operation mode of the embodiment.

FIG. 7 is a diagram showing a pattern of threshold voltage distributions after execution of a write operation of the embodiment.

DETAILED DESCRIPTION OF THE INVENTION

FIRST EMBODIMENT

Figure 1:
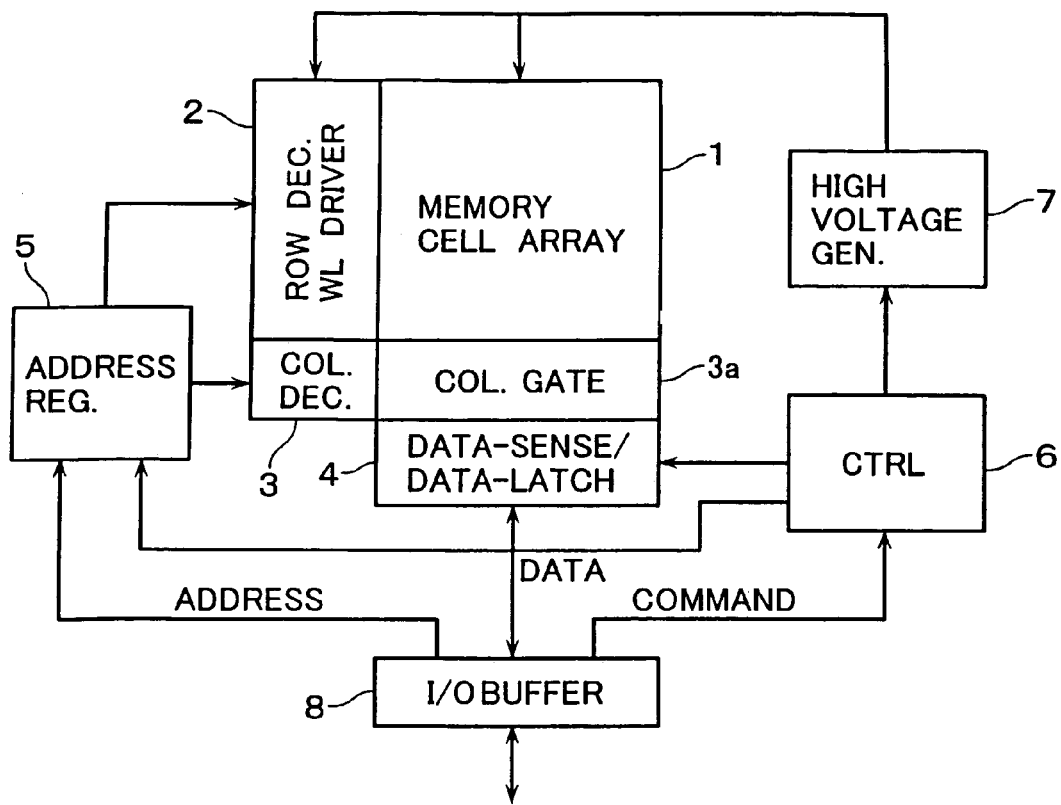
FIG. 1 is a diagram showing an arrangement of an EEPROM chip in accordance with one embodiment of this invention.

Referring to FIG. 1, there is shown an overall configuration of an electrically erasable programmable read only memory (EEPROM) device in accordance with one embodiment of this invention. The EEPROM shown herein includes an array 1 of rows and columns of memory cells, which are laid out in a matrix form. This memory cell array 1 may be designed so that its arrangement is of any available types including, but not limited to, the NAND type, NOR type, and DINOR type.

Figure 2:
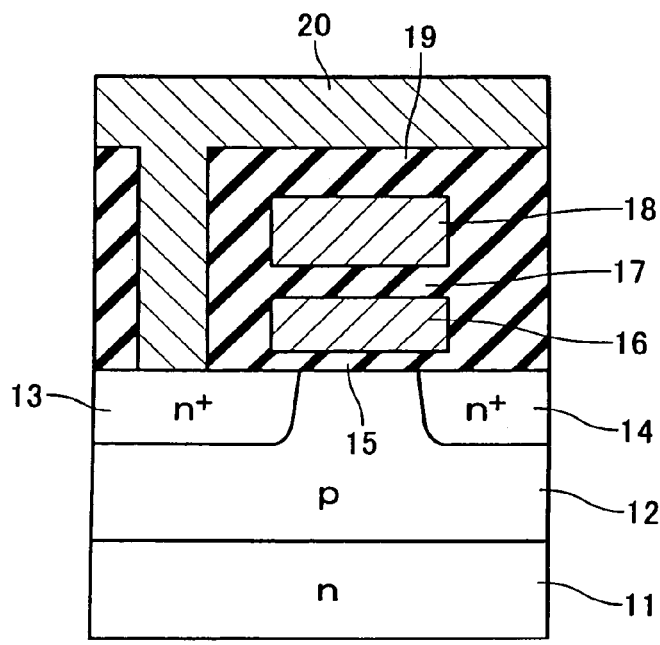
FIG. 2 is a diagram showing a structure of a memory cell used in the EEPROM of FIG. 1.

A single memory cell of the cell array 1 is structured as shown in FIG. 2. An n-type silicon substrate 11 has a surface region for formation of the memory cell array 1, in which region a p-type well 12 is formed. Over this p-type well 12, a floating gate 16 is formed with a tunnel current-flowable gate insulation film 15 which is interposed between p-well 12 and floating gate 16. A control gate 18 is insulatively stacked or "multilayered" over the floating gate 16 with an interlayer dielectric film 17 laid therebetween. n ($n^+$) type impurity-doped layers 13, 14 for use as source and drain are formed in p-well 12 so that these are self-aligned with the overlying control gate 18.

The floating gate 16 is formed of a polycrystalline silicon or "polysilicon" film whereas the control gate 18 is of either polysilicon film or polycide film (multilayer film of polysilicon and metal silicide films). The "intergate" dielectric film 17 lying between the floating gate 16 and control gate 18 is typically formed of an oxide-nitride-oxide (ONO) film, which is a multilayer film of silicon oxides with a silicon nitride sandwiched therebetween. Floating gate 16 has its lateral walls that are normally coated with a protective sidewall film made of silicon nitride or other similar suitable materials.

The floating gate 16 is independent per each memory cell. The control gate 18 is continuously formed to extend along cells in a direction perpendicular to the surface of the drawing paper sheet, for use as one of parallel word lines. The memory cell is covered with an interlayer dielectric film 19. Provided on this film 19 are parallel bit lines crossing over the word lines at virtually right angles thereto, one of which is indicated by numeral 20 in FIG. 2. This bit line 20 is connected to the underlying $n^+$-type diffusion layer 13 of the illustrative cell structure.

Selecting of a memory cell from the memory cell array 1 is performed by a row decoder 2 and column decoder 3 plus column gate 3a shown in FIG. 1. While addresses are fetched into an address register 5 through an input/output (I/O) buffer 8, a row address and a column address involved therein are decoded by the row decoder 2 and column decoder 3, respectively. Row decoder 2 includes a word-line driver operable to give to a selected word line different voltages in accordance with operation modes. A bit line is selectable by column gate 3a as selected in response to an output of column decoder 3.

The circuitry of FIG. 1 also includes a data-sense/data-latch circuit 4, which includes a sense amplifier for detection or sensing of read data and a data latch for holding write data therein. Date writing is done through repeated execution of a write pulse application operation and its following verify-read operation in a way as will be set forth in detail later in the description. Sequence control of this write mode is to be done by a control circuit 6. While erase and verify-read operations are executed during data erasing also where necessary, the control circuit 6 is also responsible for the sequence control of such erase mode.

A variety of kinds of high voltages for use during the write, erase and read operations, which are potentially higher than the EEPROM chip's supply voltage, are generated by a high-voltage generator circuit 7 and then supplied to the row decoder 2 and/or cell array 1 under control of the control circuit 6 in an operation mode-dependent way.

Figure 3:
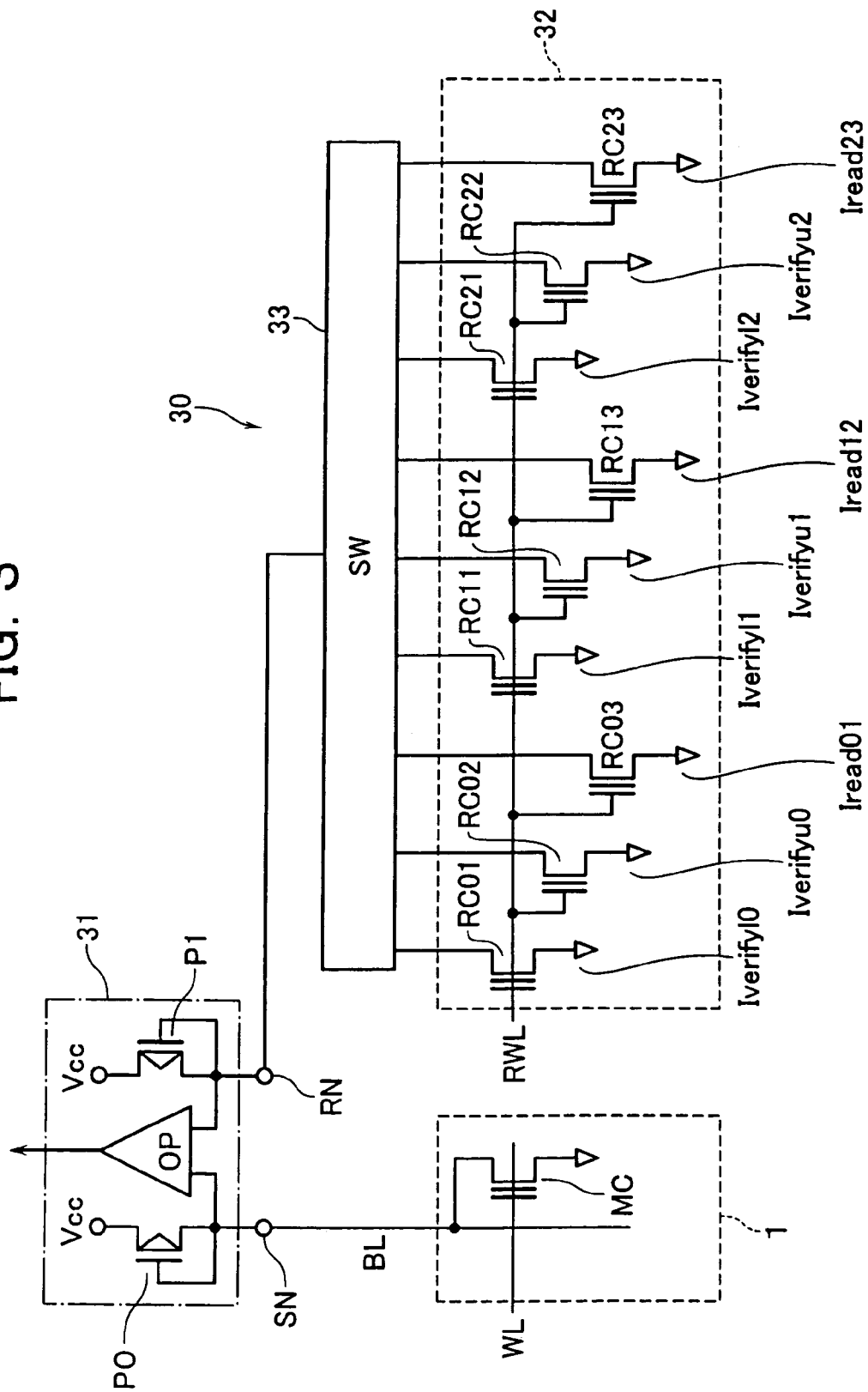
FIG. 3 is a diagram showing a configuration of data read circuitry of the embodiment.

Referring next to FIG. 3, there is depicted a configuration of main part of data readout circuitry operatively responsible for verify-read operations to be executed during an ordinary read operation and write operation. The circuitry shown herein includes a sense amplifier 31. This sense amp 31 is configured from an operational amplifier OP and a couple of P-channel metal oxide semiconductor (PMOS) transistors P0, P1. The op-amp OP has input terminals for use as a sense node SN and a reference node RN, to which the PMOS transistors P0, P1 are connected as current source load, respectively. Also connected to the sense node SN is a bit line BL as coupled to a presently selected memory cell MC in the memory cell array 1. The reference node RN is associated with one of reference current sources which is connected thereto after selection by a reference current source circuit 30. This reference current source circuit 30 is made up of a plurality of reference current sources 32 and a switch circuit 33 operable to select one from among these current sources 32.

Figure 4:
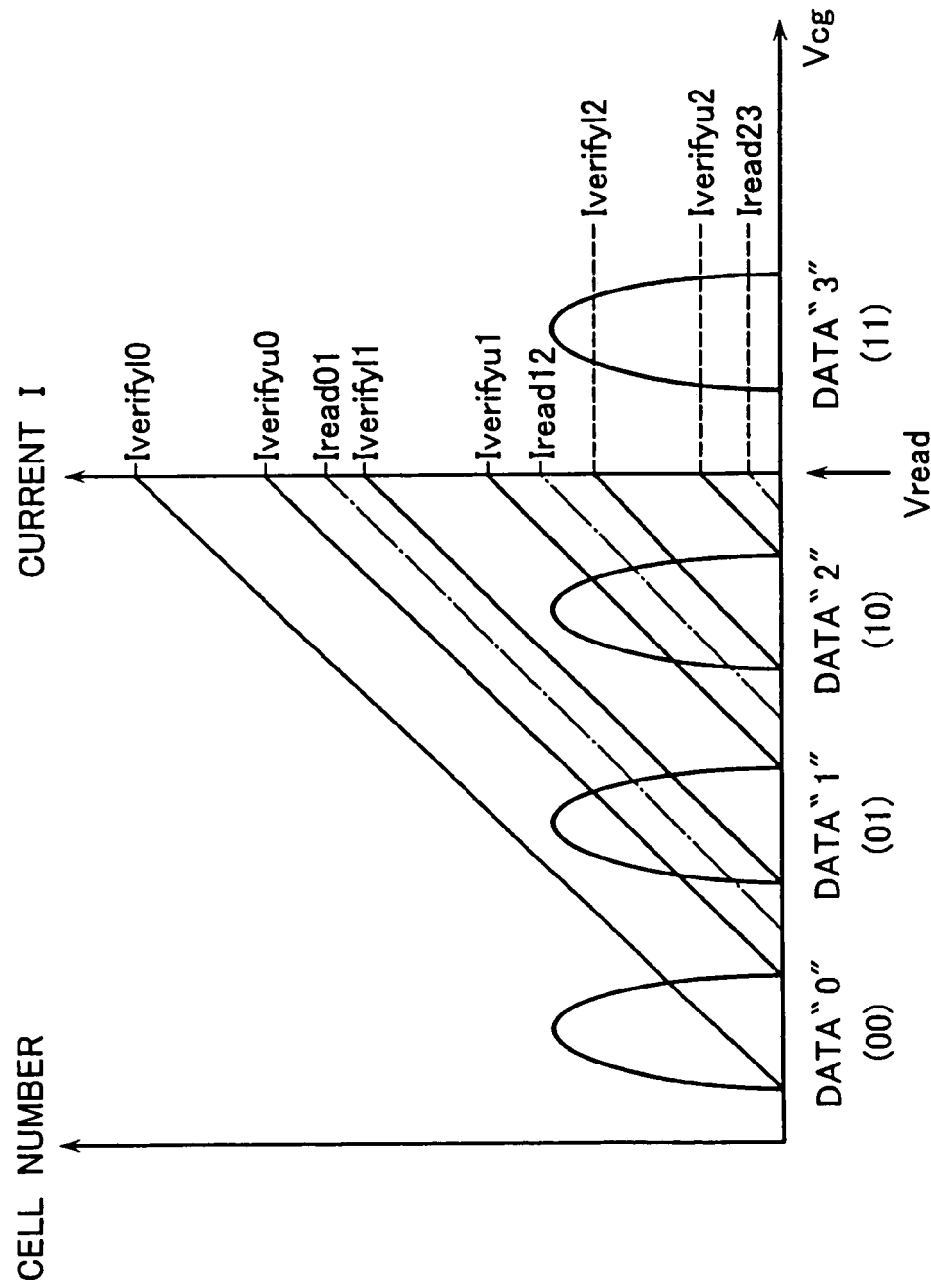
FIG. 4 is a graph for explanation of principles of read and verify-read operations of the embodiment.

The reference current sources 32 are designed to employ a plurality of reference cells RC01 to RC03, RC11–RC13 and RC21–RC23, which are required for ordinary read and verify-read operations. These reference cells RC01–RC23 are substantially the same in structure as the memory cells MC. Prior to detailed explanation of the reference current sources 32, the principles of the ordinary read and verify-read operations in the illustrative embodiment will first be set forth with reference to FIG. 4 below. FIG. 4 is a graph demonstrating an experimentation result in the case of four-value data storage per cell by way of example, which graph shows the relationship of a threshold voltage distribution of each data and cell currents as conducted during ordinary-read and verify-read operations. The four-value data storage scheme is also called four-level or four-bit per cell technology.

Figure 19:
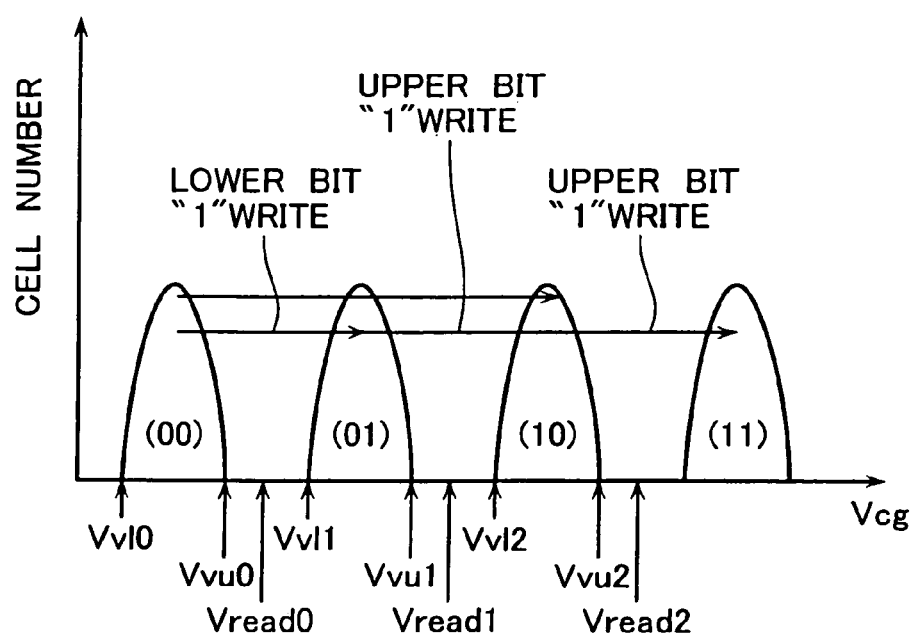
FIG. 19 is a graph showing threshold voltage distributions of four-value data.

The 4-data write procedure is the same in principle as the prior art scheme that has been discussed in conjunction with FIG. 19 in the introductory part of the description. More specifically, a data bit with a voltage level "00" is defined to be a state with the lowest threshold voltage. One example is that in "flash" EEPROMs, all the cells in a certain memory block are erased together at a time—known as "all-at-a-time" erase or "all-at-once" erase among those skilled in the flash device art—prior to execution of data writing to thereby establish an erase state of the "00" level. From this ease state, writing of "11," "01" and "10" will be done by execution of bit data writing for one or two times. Data erase is achievable in a way which follows. In the cell structure of FIG. 2, apply between the p-well 12 and control gate 18 a specific high voltage (called an erase voltage) with its polarity made positive on the p-well 12 side, causing residual electrons held on floating gate 16 to release away toward the channel side.

Data writing is executable in a way which follows. Apply a positive high voltage (write pulse) to the control gate 18 causing the threshold voltage to selectively increase while either permitting or precluding electron injection into the floating gate 16 in accordance with a data potential being presently given to either the drain or channel via a bit line. Practically the write operation is done to finally result in establishment of a prespecified write state through iterative execution of the write pulse applications to the control gate and the verify-read operations in the way as stated previously.

One noticeable feature unique to the illustrative embodiment is that as shown in FIG. 4, a read voltage Vread being given to the memory cell MC's control gate in ordinary read operations is also used with no changes during its following verify-read operation during writing mode. Note here that the read voltage Vread for use during ordinary read operations is common among any data read events irrespective of which one of the four different data bits is to be read. This means that the use of a single read voltage Vread enables accurate determination or "interpretation" of all the data levels "00," "01," "10" and "11."

And, in a verify-read operation with application of such read voltage Vread, several reference current values are set up for the data levels "00," "01" and "10" as available upon application of this read voltage Vread respectively, which are verify-read use reference current values corresponding to current values almost at the upper and lower limits of the threshold voltage distributions thereof—i.e. Iverify0 (its upper limit is Iverifyl0 and lower limit is Iverifyu0), Iverify1 (with upper limit of Iverifyl1 and lower limit of Iverifyu1), and Iverify2 (with upper limit of Iverifyl2 and lower limit of Iverifyu2).

Regarding the data "00," while its verify operation is an erase-verify operation in the case of the "all-at-once" erasing, if in a verify-read event with application of the read voltage Vread the resulting cell current is affirmed so that it is midway between the upper limit value Iverifyl0 and lower limit value Iverifyu0, then "pass" is established. Similarly in the case of "01" writing, "pass" is set if in a verify-read event with application of the same read voltage Vread the resultant cell current is affirmed to be midway between the upper limit value Iverifyl1 and lower limit value Iverifyu1. In the case of "10" write, "pass" is set if in a verify-read event with application of the same read voltage Vread the resultant cell current is affirmed midway between the upper limit value Iverifyl2 and lower limit value Iverifyu2.

It should be noted that for actually implemented verify check schemes, both of the upper limit value and lower limit value will not necessarily be used as the reference current values required. Either one of these values is solely employable when the need arises.

Also note that the verify-read of data "11" is achievable by utilization of a method having the steps of giving to the control gate a different voltage from the read voltage Vread, e.g. a verify-read voltage higher in potential than voltage Vread, and then conforming that "off" is presently established.

With execution of the above-stated verify-read operation, this does not result in guarantee of the threshold voltage of data being written as in prior art schemes but results in guarantee of data by a cell current(s) upon application of the read voltage Vread. And in the case of this embodiment, identically the same read voltage Vread is used also in ordinary read operations in a similar way to the verify-read operation. In other words, whereas in the prior art a cell current is read with setup of a read voltage between the threshold value distributions of respective data, the embodiment is such that a single type of read voltage Vread is used to perform the intended determination of "00," "01," "10" and "11" data through comparison with read-use reference current values Iread01, Iread12, Iread23 shown in FIG. 4. The read reference current value Iread01 is set so that it is midway between the verify-read reference current values Iverifyu0 and Iverifyl1. Similarly the read reference current value Iread12 is set to be midway between the verify-read reference current values Iverifyu1 and Iverifyl2. The read reference current value Iread23 is set less than the reference current value Iverifyu2.

With execution of such verify-read operation and ordinary read operation, any replacement or "reversal" between a cell current and reference current value will no longer take place principally even where deviation is found in "gm" values of memory cells concerned. This can be said because any write data is well guaranteed by a cell current at read voltage Vread. Accordingly, read errors may be precluded or at least greatly suppressed, enabling the read operation to be done at high speeds.

The reference current source circuit 30 shown in FIG. 3 is configured from several reference cells RC for use as the current sources for producing and conducting a plurality of reference currents to be used during the above-noted ordinary-read and verify-read operations, respectively. The reference current source 32 of FIG. 3 is exemplarily suited in configuration for the case of four-value data storage per cell as has been discussed in conjunction with FIG. 4. Reference cells RC01, RC02 are for production of reference currents Iverifyl0, Iverifyu0 to be used during verify-reading for "00" data check. Reference cell RC03 is a current source for generation of reference current Iread01 for use during ordinary reading for "00" data check. Reference cells RC11, RC12 are for production of reference currents Iverifyl1, Iverifyu1 to be used during verify-read for "01" data determination whereas reference cell RC13 is a current source for conducting reference current Iread12 as used during ordinary read for "01" data determination. Reference cells RC21, RC22 are for production of reference currents Iverifyl2, Iverifyu2 used during verify-read for "10" data determination; reference cell RC23 is a current source for generation of reference current Iread23 to be used during ordinary read for "10" data interpretation.

These reference cells RC01–RC03, RC11–RC13 and RC21–23 are specifically arranged so that while all of them are the same in structure and size as the memory cells MC, they have carefully adjusted gate threshold voltages which are different in value from one another to thereby ensure that a respective one of the reference current values as set forth in conjunction with FIG. 4 is obtainable upon application of the read voltage Vread to the control gate of a cell of interest. Their control gates are common-coupled together to a reference word line RWL. A read voltage same as the read voltage Vread being supplied to a selected word line WL from a word-line driver within the row decoder 2 is to be given to this reference word line RWL during read and verify-read operations.

In a verify-read operation, the switch circuit 33 operates to select one from among the verify-read reference cells RC01–RC02, RC11–12, RC21–22 in a way pursuant to write data to be checked, causing the drain of such selected cell to be connected to the reference node RN of sense amplifier 31. Alternatively in an ordinary read operation, switch circuit 33 selects one from among the ordinary read reference cells RC03, RC13, RC23 causing the drain of a selected one to be coupled to the sense amp 31's reference node RN.

Figure 5:
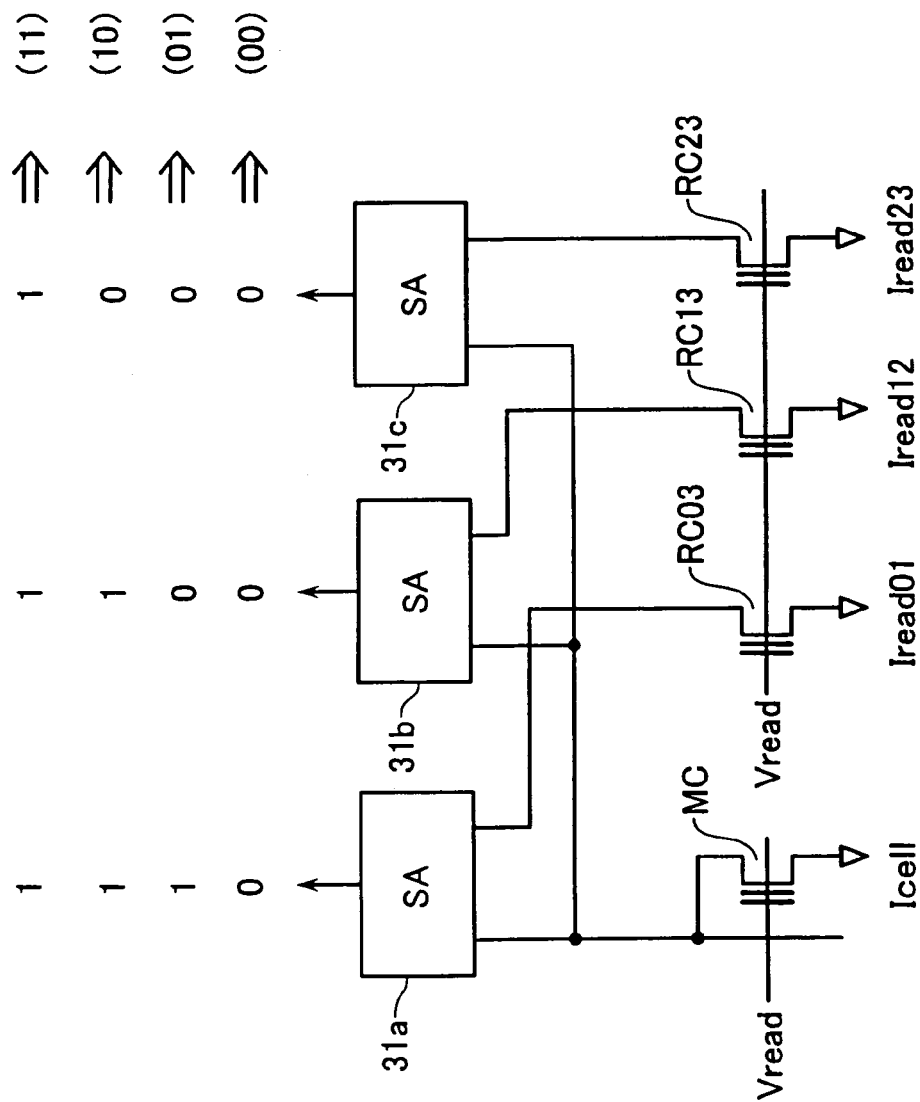
FIG. 5 is a pictorial representation for explanation of a read operation of the embodiment.

It must be noted that in order to reduce complexities in the procedure for determination of four-value data "00," "01," "10," "11," the sense amp 31 is actually designed using a plurality of sense amplifiers for enabling simultaneous selection of the read-use reference currents Iread01, Iread12 and Iread23 to ensure that respective ones are given to different reference nodes. In this respect, see FIG. 5. This diagram shows a read operation in case three separate sense amps 31a–31c are employed, which operation is for giving to these sense amps the ordinary read reference currents Iread01, Iread12, Iread23 respectively at a time. In this case, data determination or "interpretation" may be done based on whether the resultant cell current Icell is larger or smaller in value than which one of the reference currents Iread01–Iread23, in a way which follows. If Icell>Iread01, then outputs of sense amps 31a–31c are all at "0" Thus data "00" is determined. If Iread01>Icell>Iread12, then sense amp 31a's output is at "1" with outputs of the other sense amps 31b–31c set at "0" whereby data "01" is determined. If Iread12>Icell>Iread23 then outputs of sense amps 31a–b are at "1" with sense amp 31c's output set at "0" so that data "10" is judged. If Iread23>Icell then outputs of sense amps 31a–b are all at "1," permitting determination of data "11."

See FIG. 6, which is a diagram showing a waveform of a control gate voltage Vcg of a selected memory cell MC in a write mode along with that of a reference cell RC associated therewith. This is an exemplary case where the memory cell MC being presently in the data "00" erase state of FIG. 4 for example is subjected to writing of a logic "1" at its lower bit to thereby write or program "01" data. At this time, the reference cell RC to be selected by the switch circuit 33 is either RC11 or RC12, which has its control gate to which a read voltage Vread identical to that of the memory cell MC is applied. To the memory cell MC, a write pulse voltage Vpgm and a verify-read voltage Vread are applied repeatedly.

And the write pulse application results in a gradual increase in threshold voltage of the memory cell MC. When a cell current of memory cell MC upon execution of verify-reading becomes smaller than the reference current Iverifyu1 due to the reference cell RC12 by way of example, an output of the sense amplifier 31 is inverted, leading to a judgment of the termination of a present write event. Whereby the "01" data write is set at "pass." For guarantee of the lower limit of a threshold voltage distribution of "01" data (actually a corresponding cell current), it is required that the reference cell RC11 be used to also execute verify check at reference current Iverifyl1.

In the case of writing or erasing other data "00" and "10" also, a similar operation is done with a mere difference of the reference cell RC to be selected—i.e. a similar verify-read is executed while giving the read voltage Vread to reference cell RC. As per the "11" data, a verify-read voltage different from the read voltage Vread is used in the way stated supra.

With the write operation of this embodiment, since the verify read is executed for guarantee of the resultant cell current, it is very likely that the actually written data's threshold voltage distribution expands to have a greater spreadability than is possible with the prior art. An experimentation result concerning this is shown in FIG. 7. In view of the fact that a certain data state is guaranteed by a reference current value IverifyA, a threshold voltage distribution of this data state must accompany a deviation of the gm value of a memory cell between the case of its minimal value gm(min) and the case of a maximal value gm(max), which deviation is within a range of from Vth1 to Vth2 as shown in FIG. 7. Accordingly, the data state that is guaranteed by a reference current value IverifyB less than the reference current value IverifyA will possibly experience overlapping of neighboring data's threshold voltage distributions as indicated by broken lines in FIG. 7.

Fortunately the presence of this threshold value distribution overlap state hardly causes any appreciable read errors. This can be said due to the following reason. Whereas the reference current IverifyA is used during verify-read with application of the read voltage Vread, ordinary read with the use of the same read voltage Vread is executed in a way such that a cell current is to be read at the reference current value IreadA that is lower than the value of verify-read reference current IverifyA. As far as this reference current value IreadA is set intermediate between the verify-read reference current values IverifyA and IverifyB, data with guarantee by the reference current value IverifyA is successfully read without regard to any resultant threshold voltage distributions.

SECOND EMBODIMENT

Figure 8:
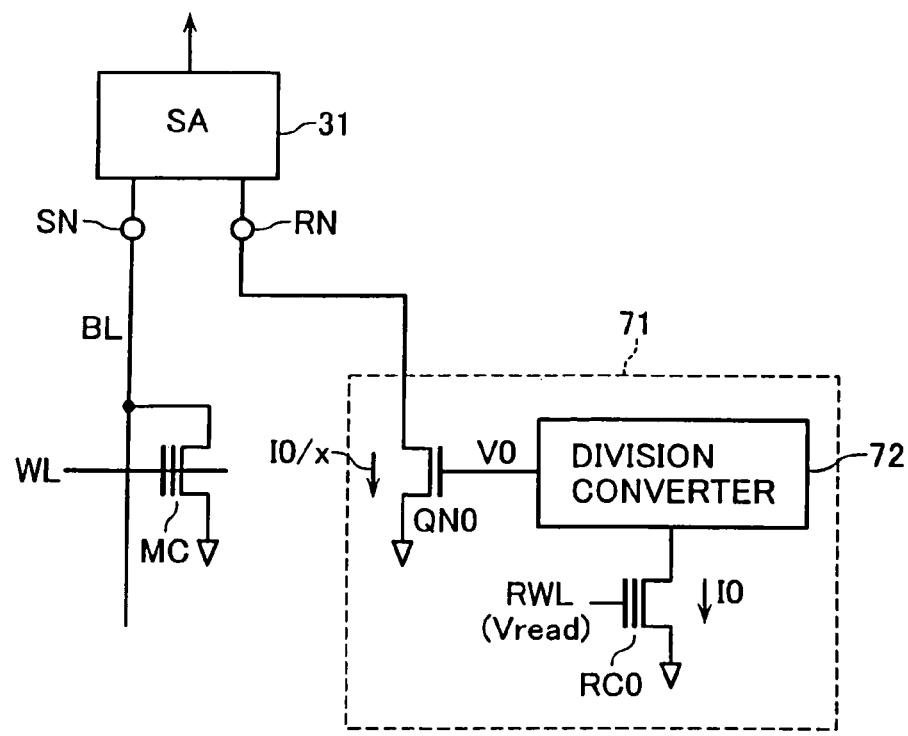
FIG. 8 is a diagram showing a configuration of read circuitry of an EEPROM chip in accordance with another embodiment of the invention.

In FIG. 4, several reference cells RC similar in structure to the memory cells MC are prepared for use as the reference current sources 32 in a way corresponding to the requisite number of reference current values concerned. This approach is modifiable so that a single "basic" reference cell RC is prepared while arranging the reference current source circuit to produce a plurality of other reference currents based on this single reference cell. FIG. 8 shows, in a way corresponding to that of FIG. 3, a configuration of a second embodiment having a reference current source circuit 71 with such an arrangement.

The reference current source circuit 71 of this embodiment is designed to employ a single reference cell RC0 which conducts a reference current I0 upon application of a read voltage Vread to the control gate thereof. And a division converter circuit 72 is provided for production of a plurality of reference currents I0/a, I0/b, . . . , which are subdivided from the reference current value I0 by positive numbers "a," "b," . . . , respectively. The illustrative circuitry includes an NMOS transistor QN0 connected to the reference node RN of a sense amplifier 31, which is arranged so that a voltage V0 is given to the gate causing a reference current as selected by the division converter circuit 72 to flow in the NMOS transistor QN0.

Figure 10:
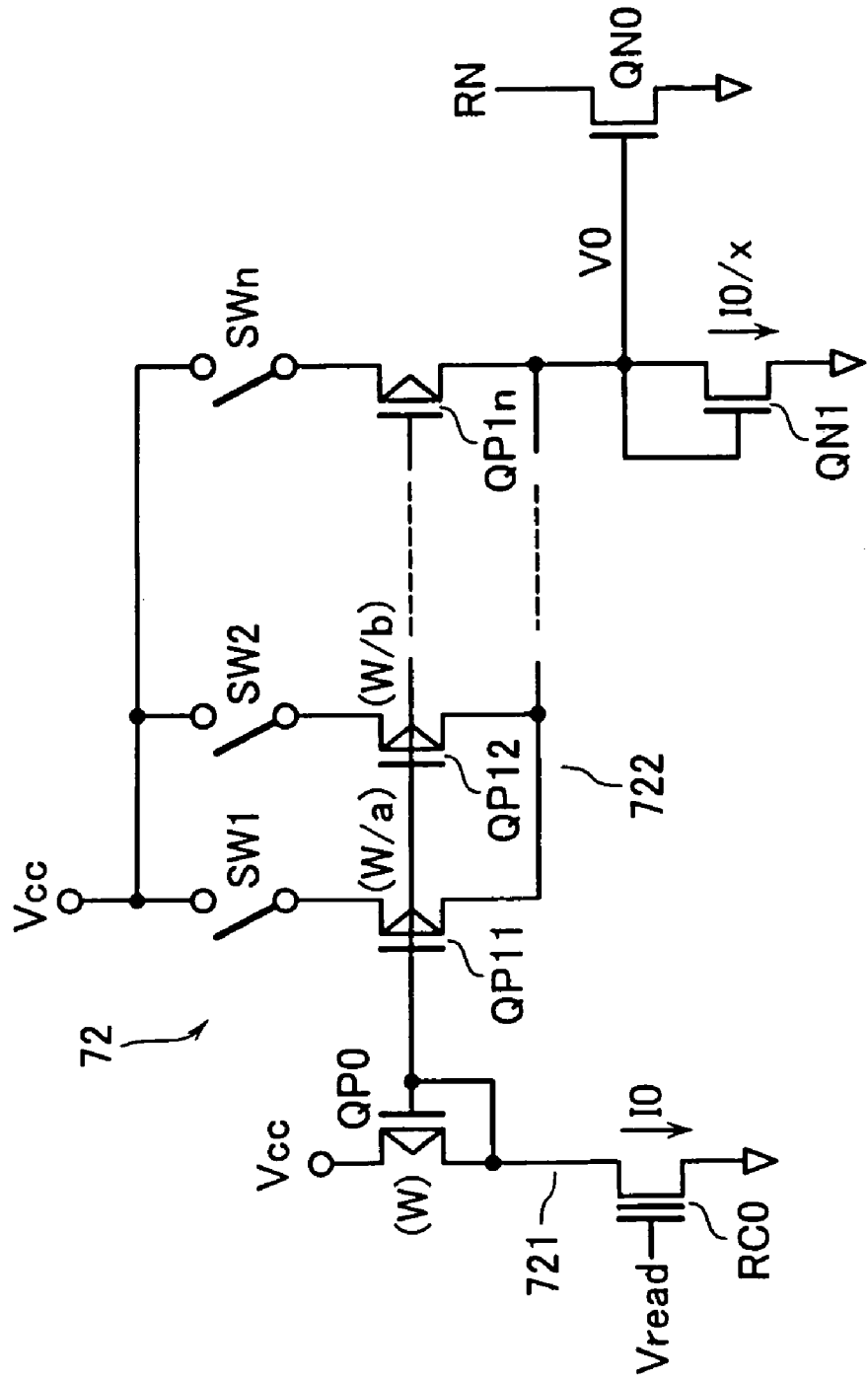
FIG. 10 is a diagram showing a configuration of a division converter circuit in FIG. 8.

A configuration of the division converter circuit 72 is shown in FIG. 10. As shown herein, this circuit includes a PMOS transistor QP0 for use as a current source load and a "basic" reference cell RC0, which make up a reference current circuit 721. The reference cell RC0 is similar in structure to memory cells MC. When giving the read voltage Vread to its control gate, a current I0 rushes to flow. This reference current circuit 721 is operatively associated with a predetermined number, n, of multiple PMOS transistors OP11, QP12, . . . , QP1n for use as current sources, which constitute a current mirror circuit 722 together with the PMOS transistor QP0. These current-source PMOS transistors QP11–QP1n are specifically designed so that their channel widths measure W/a, W/b, . . . , respectively, where "W" is the channel width of PMOS transistor QP0. This is under an assumption that all the PMOS transistors QP11–1n are identically the same in channel length as PMOS transistor QP0.

With such channel-width/channel-length settings, the PMOS transistors QP11, Qp12, . . . , QP1n serve as the intended current sources for permitting flow of reference currents I0/a, I0/b, . . . , respectively. These will be used as respective reference current sources Iverify for verify-reading and reference current sources Iread for ordinary read in the previous embodiment. These PMOS transistors QP11–QP1n are such that their sources are connected to the power supply VCC through activation switches SW1, SW2, . . . , SWn respectively, with their drains connected together to a diode-coupled NMOS transistor QN1.

This NMOS transistor QN1 is an output transistor for execution of current-to-voltage conversion, in which transistor a reference current I0/x flows. This current is determinable by one of the PMOS transistors Qp11–1n as selected by switch SW1, SW2 . . . This NMOS transistor QN1's drain voltage V0 is given to the gate of NMOS transistor QN0, which is connected to the reference node RN of sense amplifier 31. These NMOS transistors QN0, QN1 also make up a current mirror circuit. Assuming that these are the same in size as each other, a reference current I0/x is expected to flow in NMOS transistor QN0.

This embodiment thus arranged is capable of generating a plurality of ordinary-read reference currents and verify-read reference currents through subdivision of the reference current I0 that is determinable by the basic reference cell RC0. And, in a similar way to that in the previous embodiment, any required reference current may be selected by a switch in a way conformity with an ordinary-read operation and verify-read operation. Very importantly, the same read voltage Vread is given to the control gate of such reference cell RC0 during both of the verify-read and ordinary read operations, whereby the cell current-guaranteed write is executed based on the same principles as the previous embodiment.

Figure 9:
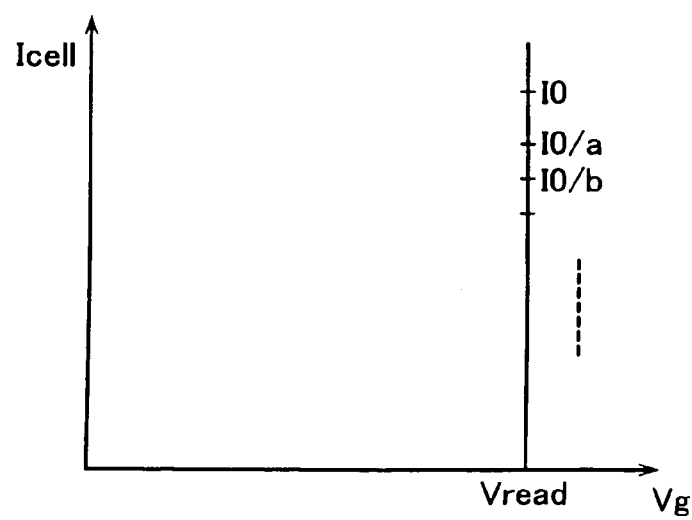
FIG. 9 is a diagram showing a reference current distribution of the embodiment of FIG. 8.

It should be noted that although the example of FIG. 9 is drawn to the case of setup of a current division ratio "x" (=a, b, . . . ) at 1 or greater, i.e., sequential decrement of I0/a, I0/b, . . . with the original reference current I0 being as a maximal value, the ratio x may alternatively be set less than 1. In other words, production of a reference current or currents greater than the reference current I0 is also permissible. One practical example is that the inherently original reference current value I0 is set at an intermediate level between many required reference current values while setting the current division ratio x to permit creation of other reference current values at upper and lower levels thereof.

An advantage of this embodiment lies in an ability to reduce complexities in the manufacture or fabrication of the reference current source circuitry, when compared to the case of formation of a great number of size-different reference cells RC with complicated structures similar to the memory cells MC as in the previous embodiment.

THIRD EMBODIMENT

The second embodiment discussed above is such that the reference cell consists of a single cell RC0, whose reference current is divided into current components or "segments" for production of a plurality of reference currents required. Due to this, simple current division can result in lack of guarantee of the minimal reference current value Iread23 as has been explained in conjunction with FIG. 4. The minimum value of reference current Iread23 is not a mere read-use reference current but the one that offers a capability to guarantee the availability of the minimum read current of a cell. The reason for this is as follows. For instance, in the case of NOR type Flash EEPROMs with an increased number of memory cells being parallel-connected to each bit line, leakage currents of multiple non-selected cells can overlap or "superpose" the current of a selected cell. Thus, any accurate data determination is no longer executable in the state that the current of on-cell is less than a total sum of leakage currents.

Figure 11:
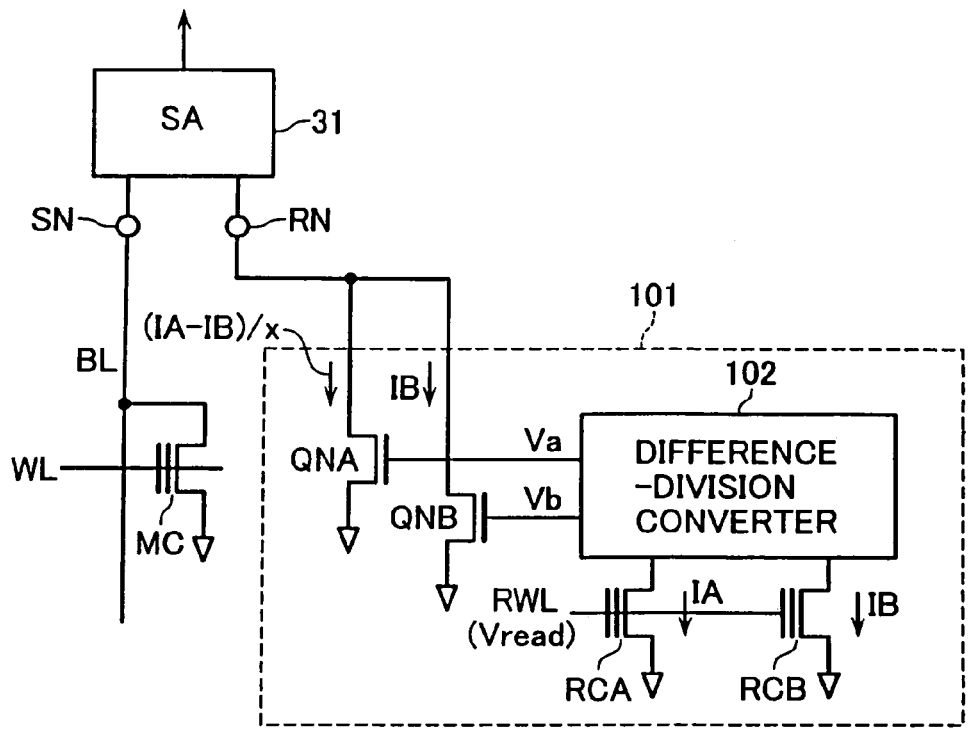
FIG. 11 is a diagram showing a configuration of read circuitry of an EEPROM chip in accordance with still another embodiment of the invention.
Figure 12:
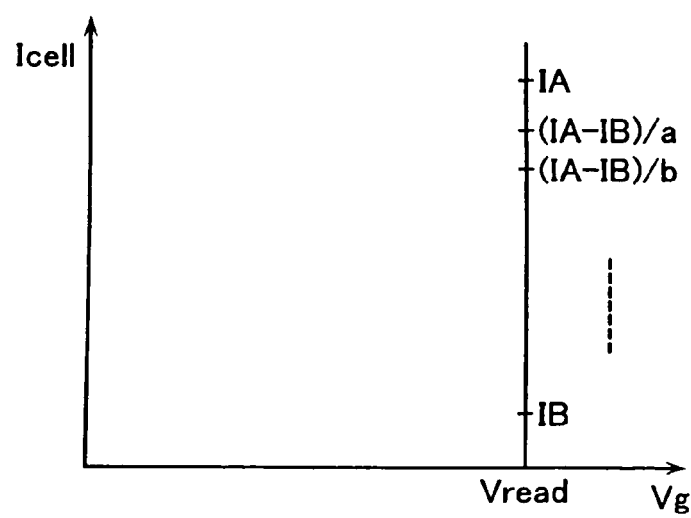
FIG. 12 is a diagram showing a reference current distribution of the FIG. 11 embodiment.

To avoid this, the illustrative embodiment is specifically arranged to make use of at least two reference cells for enabling guarantee of the minimum read current value stated supra. One such circuit configuration is shown in FIG. 11 in a way corresponding to that of FIG. 8. A reference current source circuit 101 shown herein comes with a couple of reference cells RCA and RCB, wherein the former cell exhibits a current value IA when applying the read voltage Vread to the control gate thereof whereas the latter has a current value IB upon application of read voltage Vread to its control gate. Here, the value IA is greater than IB. The reference cell RCB is for guarantee of the minimum reference current. And a difference division converter circuit 102 is provided for generation of several reference current values (IA–IB)/a, (IA–IB)/b, . . . falling within a range defined by the minimum current value IB and maximum current value IA. A respective one of these current values is equal to a difference between the current values IB and IA divided by a positive number "a," "b," . . .

The circuitry of FIG. 11 includes a sense amplifier 31 having its reference node RN, to which a parallel combination of two NMOS transistors QNA, QNB is connected. The NMOS transistor QNB is the one that guarantees the minimum read current. More specifically the difference division converter circuit 102 for driving NMOS transistors QNA, QNB is arranged to ensure that the minimum current IB determinable by the reference cell RCB flows in NMOS transistor QNB while at the same time permitting flow in NMOS transistor QNA of a reference current as divided by the difference division converter circuit 102 to have a value of (IA–IB)/x.

Figure 13:
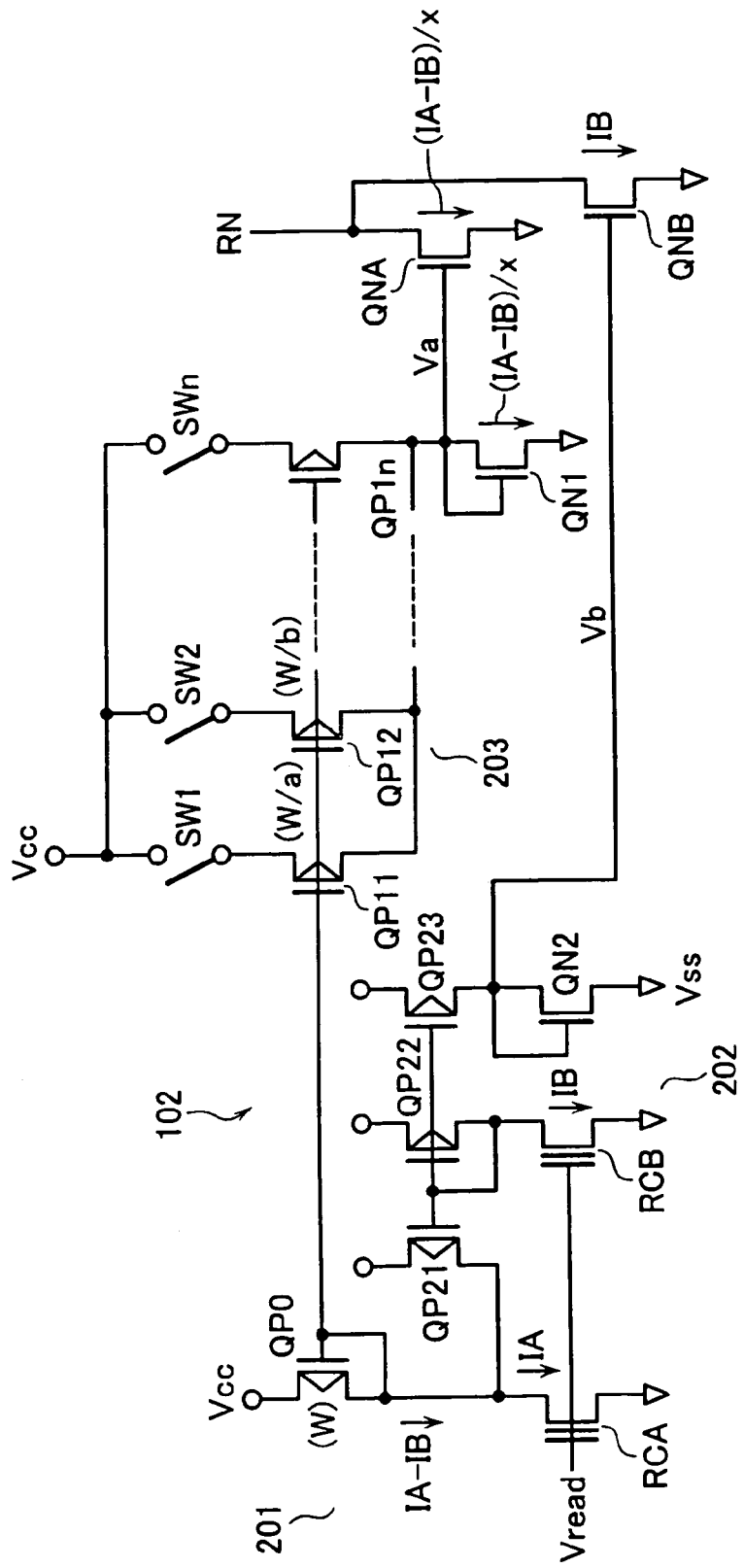
FIG. 13 is a diagram showing a configuration of a difference division converter circuit of FIG. 11.

A practically reduced configuration of the difference division converter circuit 102 is shown in FIG. 13. This circuit includes two, first and second reference current circuits 201 and 202. The first reference current circuit 201 is made up from a single reference cell RCA and a PMOS transistor QP0 for use as a current source. The second circuit 202 is formed of another reference cell RCB and current-source PMOS transistor QP22. The reference cells RCA, RCB used herein are virtually the same in structure as the memory cells MC. Each reference cell RCA, RCB is carefully adjusted in threshold voltage, causing a current IA, IB to flow therein upon application of the read voltage Vread to the control gate thereof.

The PMOS transistor QP22 of second reference current circuit 202 is operatively associated with a PMOS transistor QP23, which makes up a current mirror circuit together with transistor QP22. PMOS transistor QP23 permits a current IB to flow in a diode-coupled NMOS transistor QN2. NMOS transistor QN2 is the one that converts the current into a corresponding voltage. Its drain voltage Vb is to be supplied to the gate of one NMOS transistor QNB being connected to the sense-amp reference node RN. Supposing that NMOS transistors QNB and QN2 are the same in size as each other, the current IB must flow in NMOS transistor QNB.

The FIG. 13 circuitry also includes another PMOS transistor QP21, which constitutes a current mirror together with the PMOS transistor QP22 of second reference current circuit 202. PMOS transistor QP21 permits the current IB to be fed also to the reference cell RCA of first reference current circuit 201. This in turn forces a specific current with its value equivalent to a difference between the two reference current values, i.e. value IA–IB, to flow into the load PMOS transistor QP0 of first reference current circuit 201.

The first reference current circuit 201 is operatively associated with a plurality of, n, PMOS transistors QP11, QP12, . . . , QP1n, which make up a current mirror circuit 203 together with the PMOS transistor QP0. These PMOS transistors Qp11–QP1n are designed in on-chip dimensions so that their channel widths are sequentially set at "W/a," "W/b," . . . , respectively, where W is the channel width of PMOS transistor QP0. Assume here that these are the same in channel length as PMOS transistor QP0.

With such an arrangement, the PMOS transistors QP11–QP1n act as current sources for permitting flow of reference currents with values of (IA–IB)/a, (IA–IB)/b, . . . , respectively. These are to be used as respective reference current sources Iverify during verify-read and respective reference current sources Iread during ordinary read in the embodiments discussed previously. PMOS transistors QP11–1n are such that their sources are connected to the power supply VCC through activating switches SW1, SW2, . . . , SWn respectively whereas drains are common-connected together to a diode-coupled NMOS transistor QN1.

Thereby obtained at the NMOS transistor QN1 are a plurality of ordinary read-use reference currents and verify-read use reference currents (IA–IB)/x, which are determinable by PMOS transistors QP11, QP12, . . . , QP1n as selected by the switches SW1, SW2, . . . , SWn. This NMOS transistor QN1's drain voltage Va is given to the gate of another NMOS transistor QNA being connected to the reference node RN of comparator 31. Assuming that NMOS transistors QNA, QN1 are the same in size as each other, the same current as QN1 is expected to flow in NMOS transistor QNA.

It has been stated that with this embodiment, the reference current on the reference node RN side has a specific value equivalent to a sum of a division of a difference between two reference current values IA and IB, i.e. (IA–IB)/x, and the minimum current value IB while guaranteeing such minimum current value IB. Consequently as in the prior embodiments, the reference current selected by activation switch is obtainable in response to a present operation mode, which in turn makes it possible to execute write in such a way that data is guaranteed by a read current while at the same time reliably assuring the availability of a minimal read current required.

It should be noted that although in the above example two reference cells are used to establish the range for current division, the difference division converter circuit may alternatively be modified so that three or more reference cells are employed for subdivision of the cell current range into a plurality of sub-ranges to thereby permit generation of a difference current value in each of these subranges.

In the embodiments stated above, the more than one reference cell RC is arranged to be the same in structure as the memory cells MC. This is due to some reasons. Principally the reference current or currents may also be created by use of presently existing standard transistors. However, this approach does not come without accompanying a penalty which follows: in cases where the memory cells MC of memory cell array 1 decrease in the average gm value due to possible deviation in fabrication process parameters or the like, the distribution of "00" data of FIG. 4 can sometimes "override" the state of negative threshold voltage when executing verify-read with a reference current value while referring to a certain transistor as fabricated through different processes from memory cells MC. This would result in an unwanted increase in current leakage at non-select cells during ordinary read operations, which in turn leads to an inability to execute normal read in any way. On the contrary, if the reference current source is configured from a reference cell(s) RC being the same in structure as the memory cells MC, then the above-noted problem is avoidable because of the fact that the reference cell or cells RC may well reflect any possible variation or deviation in the average cell characteristics of a chip.

An explanation will next be given of a method for checking the data write (or erase) state of a memory cell as has been programmed in the foregoing embodiments discussed above. Traditionally such write data check is done through measurement of a threshold voltage distribution(s). In this case, a control voltage is externally given to the gate of a memory cell MC while letting a check current level be kept constant; then, let a specific control voltage value at which the memory cell MC changes from turn-on to off be set at a gate threshold voltage of such memory cell. In contrast, with the EEPROM in accordance with this invention is such that as has been set forth in conjunction with each embodiment stated supra, memory cell data must experience the write-verify read for guarantee of a cell current; additionally, as previously stated using FIG. 7, any possible threshold voltage distribution overlap or superposition is made acceptable between neighboring data items. As a consequence, risks of data verify/check incapabilities can occur even upon execution of the threshold voltage distribution measurement that is similar to the prior art.

The reference current source circuit 101 shown in FIGS. 11 and 13 is also utilizable as a current difference dividing circuit. More specifically, the current difference divider circuit in accordance with this embodiment includes a first current source (RCA) that is operable to generate a first current IA, a second current source (RCB) operable to generate a second current IB that is less in magnitude than the first current IA, and a third current source for generation of a difference current (IA−IB) equivalent in magnitude to a difference between the first and second currents to thereby create a third current (IA−IB)/x (see FIG. 13) obtainable by division of the difference current. The third current source is configured from PMOS transistors QP0, QP11, QP12, . . . , QP1n and NMOS transistors QN1 and QNA as shown in FIG. 13. The current divider further includes a fourth current source, which is made up of PMOS transistors QP22–QP23 and NMOS transistors QN2 and QNB, for generating a fourth current IB that is obtainable through mirror processing of the second current IB. The third and fourth currents are added together to provide a fifth current, which is then output to the reference node RN.

In the case of the current difference divider circuit, it is possible to design the first current source RCA and second current source RCB to employ standard or ordinary transistors with no floating gates rather than the transistors for use as the memory cells of EEPROM. In this case, the transistor making up the first current source RCA is specifically designed to have a threshold voltage lower than a threshold voltage of the transistor making up the second current source RCB.

FOURTH EMBODIMENT

Figure 14:
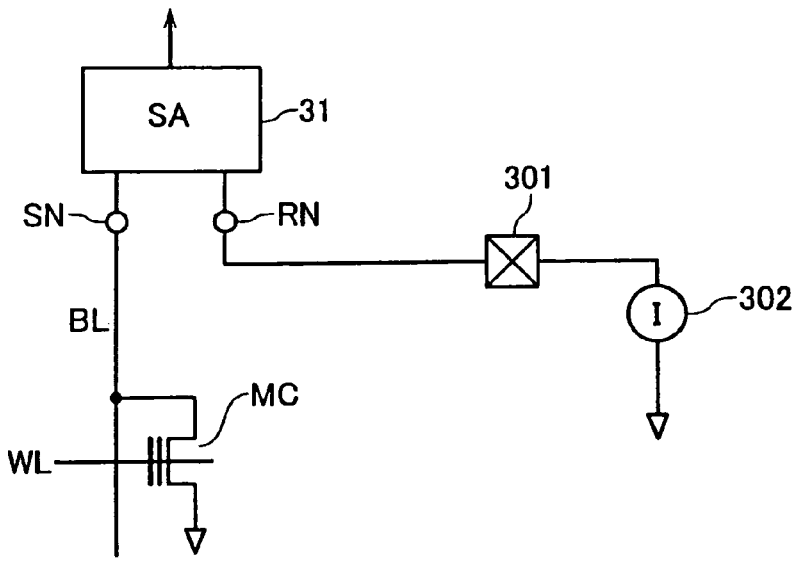
FIG. 14 is a diagram showing a configuration of circuitry for measurement of a cell current distribution(s).

To avoid the problem above, a fourth embodiment of this invention is arranged to perform cell current distribution measurement for write data state check. More specifically as shown in FIG. 14, an EEPROM chip is provided with an external connection pad 301, to which an external reference current source 302 is connected. The external current source connection pad 301 is to be connected to the reference node RN of a sense amplifier 31. This sense amp 31 has its sense node SN as coupled to selected memory cell MC via a bit line BL. A read voltage Vread is applied to word line WL connected to the control gate of the memory cell MC. And the value of a current of such external reference current source 302 is scanned to monitor or "watchdog" a specific current value at which an output of sense amp 31 attempts to invert.

Figure 15:
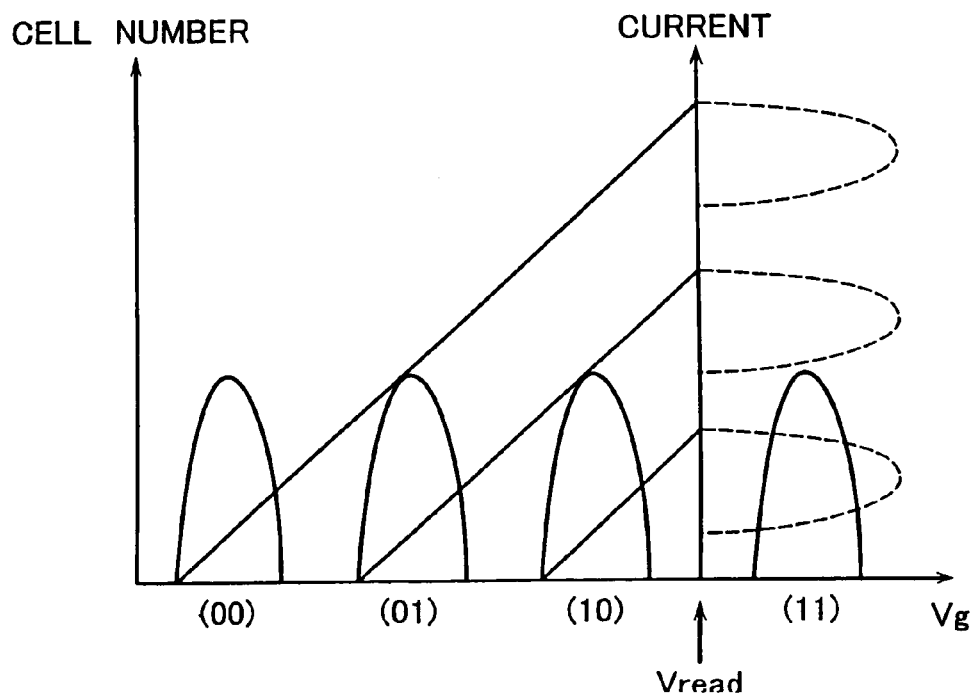
FIG. 15 is a graph showing cell current distributions as measured by use of the FIG. 14 circuitry.

Whereby, as shown in FIG. 15, cell current distribution patterns corresponding to four-value data are thus obtained. In FIG. 15, such 4-value data's threshold voltage distributions are indicated by solid lines whereas cell current distribution patterns available upon reading of "00," "01," "10" data with the read voltage Vread are indicated by dotted lines. Regarding "11" data, any appreciable cell current no longer flows during application of the read voltage Vread so that no current distributions are obtainable; and, no needs arise to do so. While the graph of FIG. 15 demonstrates threshold voltage distribution patterns without accompanying any overlap or superposition between neighboring data distributions, the cell current distributions indicated by dotted lines will hardly overlap each other as far as data write is completed successfully. This is true even when the threshold voltage distributions could overlap each other as stated previously.

FIFTH EMBODIMENT

Figure 16:
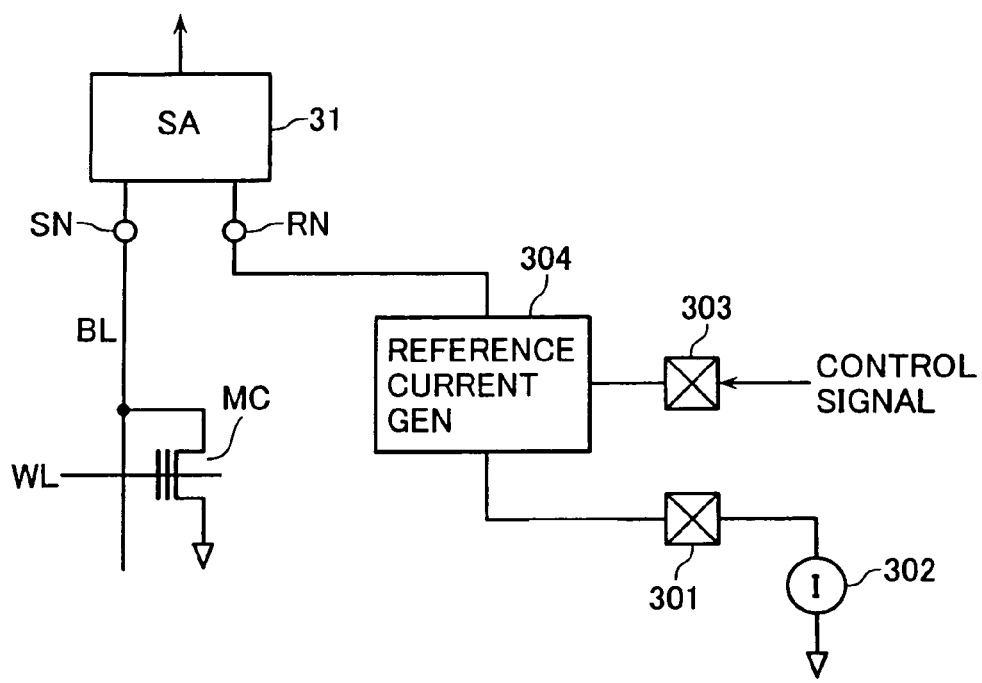
FIGS. 16 and 17 are diagram each showing a configuration of another circuitry used for cell current distribution measurement.

Turning to FIG. 16, there is shown on-chip circuitry in accordance with a fifth embodiment of the invention, with the cell current distribution measurement scheme of FIG. 14 being modified. In this case the external reference current source 302 to be connected to the reference current source pad 301 is fixed. This chip involves a built-in reference current generator circuit 304 operable to generate a reference current for distribution draw-up/formulation, which has its value equal to a current value of this external reference current source 302 divided by a number "z," where z is positive, and then couple it to the reference node RN of sense amplifier 31. And an external control signal pad 303 is provided for receipt of an external control signal as used to appropriately control this reference current generator circuit 304.

The reference current generator circuit 304 is configurable from circuitry employing a current mirror circuit for generating a plurality of reference currents at certain subdivision ratio in a similar way in principle to that of the reference current source circuit 71 used in the FIG. 8 embodiment stated supra.

With the use of such cell current distribution measurement scheme, it is no longer required to change or modify the inherent current value of the external reference current source 302, which in turn makes it possible to lighten the burden or load of externally associated measurement equipment or instrument.

SIXTH EMBODIMENT

Figure 17:
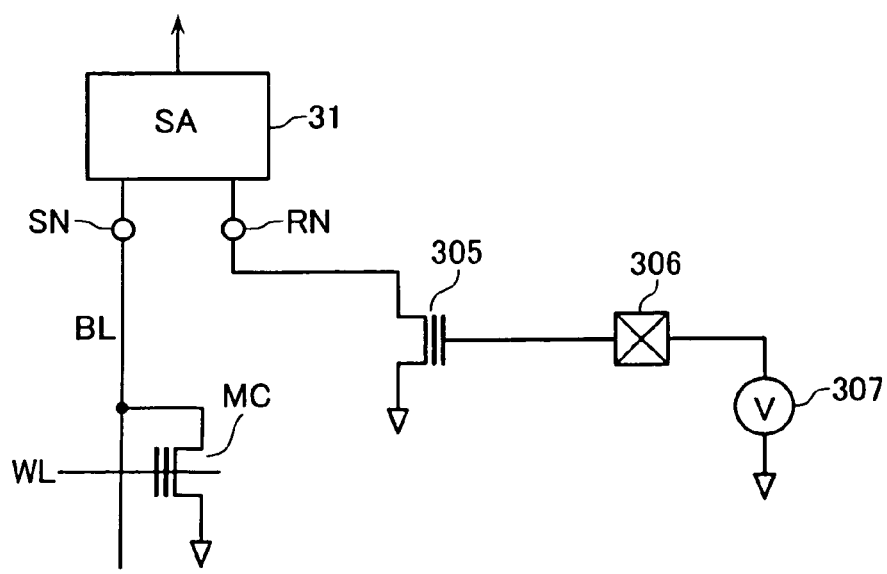
Figure 18:
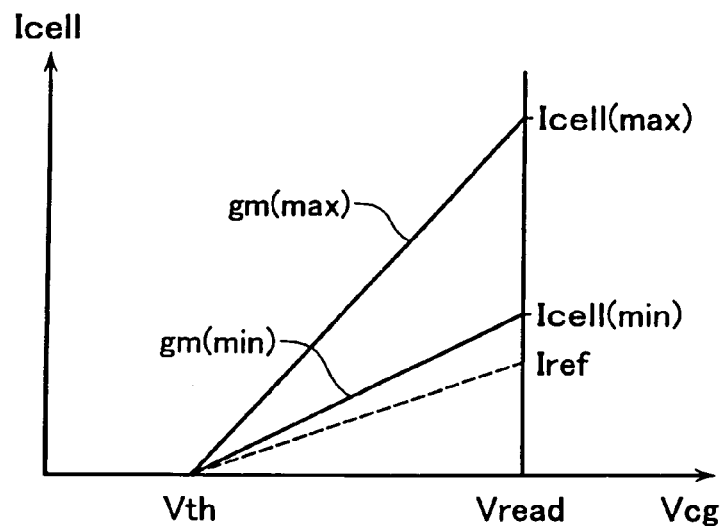
FIG. 18 is a diagram showing one exemplary cell current distribution in one prior art EEPROM.

Turning next to FIG. 17, there is shown circuitry with another cell current distribution measurement scheme in accordance with a sixth embodiment of the invention. As shown herein, a reference transistor 305 for use during distribution measurement is provided, which has a drain connected to the reference node RN of sense amplifier 31, a source coupled to ground, and a gate connected to an external voltage source pad 306. Preferably the distribution measuring reference transistor 305 is a reference cell similar in structure to the memory cells MC of EEPROM chip. Pad 306 is connected to an external reference voltage source 307 operatively associated therewith.

In this arrangement, scan a voltage of the external reference voltage source 307. Then, let the scanned voltage be subject to voltage-current conversion at the distribution measuring reference transistor 305 for monitoring of a certain voltage value whereat the sense-amp 31's output inverts. Supposing that the voltage-versus-current characteristics of distribution measuring reference transistor 305 are known in advance, it is possible to obtain the intended cell current distribution of write (or erase) data as discussed in conjunction with FIG. 15.

Although the above embodiments are directed to the case of multi-value data storage per cell, this invention should not exclusively be limited thereto and may also be applicable successfully to two-value or binary data storage architectures. In the case of 2-value data storage, a logic "1" data state with higher threshold voltage and a "0" data state with lower threshold voltage are typically employed. A read voltage used in this case is potentially set to be midway between the "0" and "1" data's threshold voltage distributions. In case "0"-data write is executed with the "1" data regarded as an erase state, prior art EEPROMs are designed to execute cell's turn-on/off determination in a write-verify read mode by use of a read voltage lower in potential than a read voltage used during ordinary reading. The illustrative embodiment, by contrast, is such that the same read voltage as that during ordinary read is used in verify-read cycles also—in a similar way to that of the embodiments with 4-value storage scheme stated supra—to thereby execute write with increased or maximized cell current guarantee. This enables successful execution of write under no influence of the gm values of the memory cell MC.

What is claimed is:

1. A current difference dividing circuit comprising:
   a first current source for generation of a first current;
   a second current source for generating a second current less than the first current;
   a third current source for generating a difference current of the first current and the second current and for generating a third current resulting from division thereof;
   a fourth current source for generating a fourth current obtained by mirroring of the second current; and
   a circuit which adds the third and fourth currents together to thereby provide a fifth current for output.

2. The circuit according to claim 1, wherein said third current source is variable in division ratio of the difference current.

3. The circuit according to claim 2, wherein the third and fourth current sources include:
   a first P-channel metal oxide semiconductor ("PMOS") current mirror circuit for supplying to said first current source a current corresponding to an output current of said second current source;
   a first output N-channel MOS (NMOS) transistor for conversion of a current of said first PMOS current mirror circuit to a voltage;
   a load PMOS transistor permitting flow of a difference current of the first current of said first current source and the second current from said first PMOS current mirror circuit;
   a plurality of current source PMOS transistors making up a second current mirror circuit together with said load PMOS transistor, for generating currents with a plurality of magnitudes;
   a switch circuit for selective activation of outputs of said plurality of current source PMOS transistors;
   a second output NMOS transistor for converting a current as selected by said switch circuit to a voltage and for outputting the voltage; and
   two current source NMOS transistors having gates to which output voltages of the first and second output NMOS transistors are supplied and having drains connected to an output node of the fifth current.

4. The circuit according to claim 1, wherein said first current source includes a transistor lower in threshold than a transistor making up said second current source.

* * * * *